United States Patent [19]

Comizzoli

[11] 4,173,683

[45] Nov. 6, 1979

[54] CHEMICALLY TREATING THE OVERCOAT OF A SEMICONDUCTOR DEVICE

[75] Inventor: Robert B. Comizzoli, Belle Mead, N.J.

[73] Assignee: RCA Corporation, New York, N.Y.

[21] Appl. No.: 894,013

[22] Filed: Apr. 6, 1978

Related U.S. Application Data

[63] Continuation-in-part of Ser. No. 806,286, Jun. 13, 1977, abandoned.

[51] Int. Cl.$^2$ ............... H01L 21/56; H01L 23/30
[52] U.S. Cl. ........................ 428/447; 428/446; 427/82; 427/93; 427/387
[58] Field of Search ............ 427/82, 93, 347, 341, 427/387; 357/52, 72; 428/447, 446

[56] References Cited

U.S. PATENT DOCUMENTS

| | | | |
|---|---|---|---|
| 3,447,975 | 6/1959 | Bilo | 357/72 |
| 3,482,977 | 12/1969 | Baker | 96/36.2 |
| 3,496,427 | 2/1970 | Lee | 357/72 |
| 3,549,368 | 12/1970 | Collins et al. | 96/36.2 |
| 3,586,554 | 6/1971 | Couture | 427/93 |
| 3,788,895 | 1/1974 | Schimmer | 427/93 |
| 3,911,169 | 10/1975 | Lesaicherre | 427/93 |
| 3,946,427 | 3/1970 | Iwasawa | 357/72 |
| 4,001,870 | 1/1977 | Saiki | 357/72 |
| 4,017,340 | 4/1977 | Yerman | 357/72 |

Primary Examiner—Michael F. Esposito
Attorney, Agent, or Firm—H. Christoffersen; D. S. Cohen; T. H. Magee

[57] ABSTRACT

A method of manufacturing a semiconductor device having a passivating overcoat of insulating material disposed thereover comprises treating the overcoat with a silane solution prior to encapsulating the device.

4 Claims, No Drawings

CHEMICALLY TREATING THE OVERCOAT OF A SEMICONDUCTOR DEVICE

This application is a continuation-in-part of U.S. application Ser. No. 806,286, filed June 13, 1977, and now abandoned.

This invention relates to a method of chemically treating a passivating overcoat of a semiconductor device immediately prior to encapsulating the device.

In manufacturing semiconductor devices, processing steps are generally performed in order to protect the device against adverse ambient conditions, such as high humidity, corrosive vapors, and mechanical abrasions. Such processing steps typically include the step of depositing a passivating overcoat of insulating material over the essentially finished, metallized device, in order to immobilize ionic impurities, prevent the penetration of moisture and harmful gases, and provide mechanical protection. As a final step, integrated circuit devices are commonly packaged in organic plastic encapsulating materials which are not the equivalent of a hermetic seal. Although improvements are being made in plastic packaging materials, there are inherent limitations in encapsulating organic compounds with respect to their purity and permeability to moisture and gasses. Consequently, the underlying passivating layers are necessarily exposed to a certain amount of moisture. Also, hermetic devices often contain some moisture in the device cavity.

In various electronic devices, such as integrated circuits and high-voltage power transistors, electrical currents exist at the surfaces of passivating layers, and, in the presence of adsorbed water, play a critical role in the performance and reliability of such devices. Excessive surface conduction, induced by moisture, can increase junction leakage of high-voltage devices, cause unwanted field inversion in integrated circuits, and cause early failure of circuit metallization by corrosion or other metal-transport processes. In the presence of moisture, these surface currents can be quite high, and, at elevated temperatures, corrosion can completely disrupt an aluminum metallization pattern on an integrated circuit in a matter of days. In addition, moisture-enhanced surface conduction may lead to field inversion in CMOS integrated circuits, which increases the substrate leakage current. Since plastic packages, and to a limited extent, ceramic packages are not impermeable to moisture, this excessive surface conduction remains a problem. The present invention provides a technique for significantly decreasing the surface conduction on the passivating layers of encapsulated semiconductor devices.

In accordance with the novel method of the present invention, a passivating overcoat of insulating material, which is disposed over a semiconductor device, is treated with an organosilane as the step prior to encapsulating the device in a plastic package. The organosilane should contain an organic functional group which remains on the passivating overcoat after the treatment, the functional group being free of one or more atoms selected from the group consisting of nitrogen, oxygen and fluorine. Such organosilanes reduce the propensity of the insulating surface to adsorb and retain moisture, and thereby decrease the surface conduction of the insulating layer in the presence of moisture. Preferably, the organosilane is selected from the group consisting of hexamethyldisilazane $[((CH_3)_3Si)_2NH]$, triacetyloxyvinylsilane $[CH_2=CHSi(OCOCH_3)_3]$, and 3-chloropropyltrimethoxysilane $[Cl(CH_2)_3Si(OCH_3)_3]$. Hexamethyldisilazane is available commercially from PCR Research Chemicals Inc., Box 1778, Gainesville, Fla.; the latter two organosilanes are available commercially as Dow Corning Z-6075 and Dow Corning Z-6076, respectively, from Dow Corning Corporation, Box 1592, Midland, Mich.

It is believed that such organosilanes react with OH groups, adsorbed to atoms at the surface of the insulating layer, whereby a silicon atom in the organosilane molecule bonds to an oxygen atom in the surface, thereby taking the place of the hydrogen atom in the OH group. By having the organosilane bond to the insulating surface, the propensity of the insulating surface to adsorb and retain moisture is significantly reduced. However, organic functional groups which are bonded to the silicon atoms in the organosilane will stick out from the surface, and water molecules may then bond through hydrogen bonding to certain electronegative atoms (oxygen, nitrogen, fluorine) present in the organic functional groups. Consequently, it is necessary that these organic functional groups be free of any oxygen, nitrogen and fluorine atoms in order to prevent the further bonding of water molecules thereto via hydrogen bonds. Where the surface is treated with hexamethyldisilazane, the $CH_3$ groups, which are bonded to the silicon atoms, will stick out from the surface; for the vinyl and chloroalkyl functional silanes, the vinyl and chloroalkyl groups, respectively, stick out from the surface. With respect to the vinyl and chloroalkyl functional silanes, the silicon atoms may also bond to other oxygen atoms in the surface, thereby forming a two-dimensional polymer.

In the preferred embodiment, the organosilane compound is first dissolved in a solvent. The use of a solvent is not absolutely necessary but is more economical, since most organosilane agents are relatively expensive. I have found that solvents selected from the group consisting of 1,1,2-trichloro-1,2,2-trifluoroethane $[Cl_2FC_2ClF_2]$, isopropyl alcohol $[(CH_3)_2CHOH]$, acetone $[CO(CH_3)_2]$, and water work exceptionally well. For example, the overcoats of several semiconductor devices, used in tests reported below, were treated with an organosilane solution comprising 25% hexamethyldisilazane and 75% 1,1,2-trichloro-1,2,2-trifluoroethane by volume.

Before applying the organosilane solution, the semiconductor device is typically heated to 105° C. for about 30 minutes. The organosilane solution is then applied to the passivating overcoat either by directly depositing the solution over the overcoat using a hypodermic syringe, or by dipping the device into a container holding the solution. The object is to completely cover the passivating overcoat with a thin film of the organosilane solution. Preferably, the device is then heated to 90° C. for approximately 15 minutes, in order to evaporate solvent from the surface of the passivating layer. Next, the device is encapsulated in a typical plastic package using conventional molding techniques.

Passivating overcoats of silicon dioxide were treated in the above-described manner and then tested for surface conductivity prior to encapsulation. These measurements, done at 65% relative humidity, showed substantial decreases in surface conductivity, ranging from 100 to 1000 times lower, for the treated overcoats. In addition, this desirable lowering of surface conductivity survived the typical 16-hour bake at 175° C. used to cure molded plastic packages.

Tests were also run to determine the breakdown voltage of encapsulated semiconductor devices which were treated in accordance with the present novel method as described above. After encapsulation, these devices were subjected to autoclave exposure at 121° C. and 15 psig ($1.03 \times 10^6$ dynes/cm$^2$) for different periods of time. The results of these tests are shown in Table I.

TABLE

| | AVERAGE BREAKDOWN VOLTAGES (VOLTS) AUTOCLAVE EXPOSURE TIME | | | |
|---|---|---|---|---|
| | 0 HOURS | 20 HOURS | 50 HOURS | 100 HOURS |
| TREATED DEVICES (8) | 856V | 853V | 758V | 775V |
| CONTROL DEVICES (10) | 847V | 792V | 701V | 688V |

The breakdown voltage was read with the anode connected to a positive voltage source, and the gate and cathode connected to ground potential. Breakdown voltages at the 0.2 milliamp level were read from an oscilloscope curve tracer. Table I shows the average values of the breakdown voltage as a function of autoclave exposure. More significant than these average values is the fact that after 100 hours of autoclave exposure, one of the untreated devices degraded to a breakdown voltage of 40 volts, and two other untreated devices showed extreme electrical noise (including rf emission). The eight treated devices were well behaved.

It is emphasized that the treating step of the present novel method must be performed prior to encapsulation with no intervening processing steps, which might affect or remove the thin film of organosilane solution. For example, applying hexamethyldisilazane to an oxide layer for purposes of improving the adhesion of an applied photoresist layer and then subsequently removing the photoresist with a stripper, does not decrease the surface conductivity of the oxide layer. It is also emphasized that only certain organosilanes will lower the surface conductivity, i.e., those containing an organic functional group remaining after the treatment, which is free of any nitrogen, oxygen and/or fluorine atoms. For example, I have also tested amino-functional silane coupling agents obtained from Dow Corning Corporation, which do not abstract hydrogen. In all cases tested, these agents either increase the surface conductivity or leave it unchanged. Since these latter materials are widely used as additives to encapsulation resins used in the electronics industry to promote adhesion to metal, it is important to implement a preencapsulation treatment, such as the present method, which lowers surface conduction. The tests which I have conducted show that the present novel technique, performed on passivating layers of semiconductor devices prior to their encapsulation, substantially decreases the surface conduction on these layers, and thereby significantly improves the moisture-related reliability performance of such devices.

What is claimed is:

1. In a method of manufacturing a semiconductor device wherein a passivating overcoat of insulating material is disposed over said device prior to encapsulating said device with a packaging material selected from the group consisting of plastic, metal, ceramic and glass, the improvement comprising treating said overcoat with an organosilane as the step immediately prior to said encapsulating step, said organosilane containing an organic functional group remaining after said treatment, said functional group being free of one or more atoms selected from the group consisting of nitrogen, oxygen and fluorine.

2. A method as recited in claim 1, wherein said organosilane is selected from the group consisting of hexamethyldisilazane [$((CH_3)_3Si)_2NH$], triacetyloxyvinylsilane [$CH_2=CHSi(OCOCH_3)_3$], and 3-chloropropyltrimethoxysilane [$Cl(CH_2)_3Si(OCH_3)_3$].

3. A method as recited in claim 2, wherein said organosilane compound is dissolved in a solvent selected from the group consisting of 1,1,2-trichloro-1,2,2-trifluoroethane [$Cl_2FC_2ClF_2$], isopropyl alcohol [$(CH_3)_2CHOH$], acetone [$CO(CH_3)_2$], and water.

4. A method as recited in claim 3, wherein said organosilane solution comprises 25% hexamethyldisilazane and 75% trichlorotrifluoroethane by volume.

* * * * *